United States Patent [19]

Minata et al.

[11] Patent Number: 4,840,571

[45] Date of Patent: Jun. 20, 1989

[54] HOUSING STRUCTURE FOR DECREASING A RADIO UNIT'S SUSCEPTIBILITY TO STATIC ELECTRICITY

[75] Inventors: Shigeki Minata; Toshihiro Mori, both of Tokyo, Japan

[73] Assignee: NEC Corporation, Japan

[21] Appl. No.: 132,706

[22] Filed: Dec. 11, 1987

Related U.S. Application Data

[62] Division of Ser. No. 773,329, Sep. 6, 1985, abandoned.

[30] Foreign Application Priority Data

Sep. 10, 1984 [JP]    Japan .................................. 59-189139

[51] Int. Cl.⁴ ........................ H01R 9/09; H01R 13/53
[52] U.S. Cl. ......................................... 439/76; 320/2;
439/181; 439/271
[58] Field of Search .................... 320/2; 439/181–187,
439/426, 934, 76, 271

[56] References Cited

U.S. PATENT DOCUMENTS

| | | | |
|---|---|---|---|
| 2,628,339 | 2/1953 | Werner | 320/2 |
| 2,830,280 | 4/1958 | Webber | 320/2 |
| 3,089,071 | 5/1963 | Hartwig | 320/2 |
| 3,571,779 | 3/1971 | Collier | 439/426 |
| 4,146,291 | 3/1979 | Goff et al. | 174/5 R |
| 4,149,027 | 4/1979 | Asher et al. | 174/52 R |
| 4,233,686 | 11/1980 | Sato | 455/344 |
| 4,417,776 | 11/1983 | Motoyama | 339/17 F |

FOREIGN PATENT DOCUMENTS 213611   9/1908   Fed. Rep. of Germany .... 339/94 R

*Primary Examiner*—Gary F. Paumen
*Attorney, Agent, or Firm*—Ostrolenk, Faber, Gerb & Soffen

[57] ABSTRACT

Connecting terminals which may be connected to terminals of an external device are disposed in a housing of a radio unit at a predetermined distance from the outer surface of the housing. The housing is provided with openings in a part thereof in alignment with the connecting terminals so that the terminals of the external device are connectable to the connecting terminals through the openings. Preferably, the openings of the housing are filled with a non-conductive material.

3 Claims, 4 Drawing Sheets

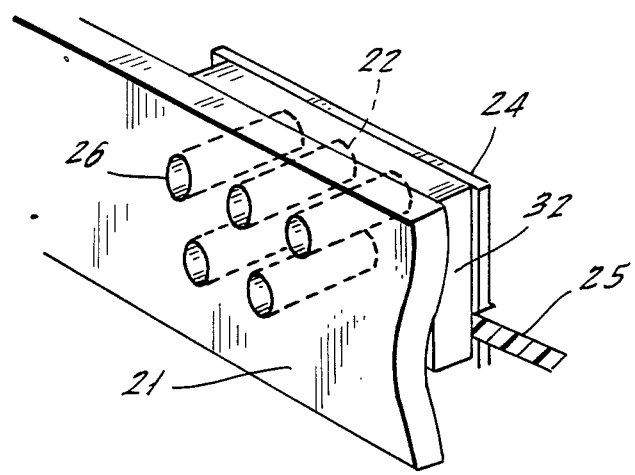
FIG. 6A.
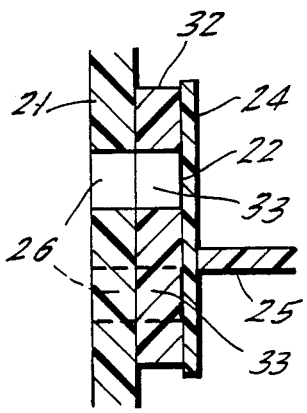 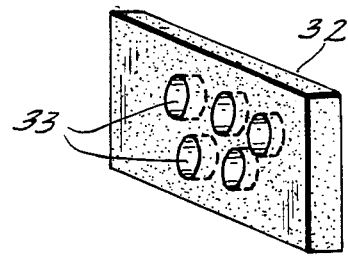
FIG. 6B.  FIG. 6C.

HOUSING STRUCTURE FOR DECREASING A RADIO UNIT'S SUSCEPTIBILITY TO STATIC ELECTRICITY

This is a division of U.S. Pat. application Ser. No. 773,329, filed Sept. 6, 1985, now abandoned.

BACKGROUND OF THE INVENTION

The present invention relates to the a housing structure for a radio unit and, more particularly, to a housing structure for a pager receiver or like radio unit of the type having charging terminals.

In most prior art radio units, charging terminals are usually disposed in a housing of the unit so as to be substantially flush with the outer surface of the housing. The problem with such a structure is that static electricity is allowed to reach circuitry installed in the housing through the charging terminals as well as the following power source line and other circuitry, often causing essential elements of the apparatus such as a central processing unit to malfunction or even be damaged. This problem is especially conspicuous in those regions and seasons in which humidity is relatively low.

SUMMARY OF THE INVENTION

It is therefore an object of the present invention to provide a housing structure for a radio unit which is sufficiently resistant to static electricity.

It is another object of the present invention to provide a housing structure for a radio unit which also withstands dust and humidity.

In accordance with the present invention, there is provided a housing structure for a radio unit which comprises connecting terminals disposed in a housing of the radio unit at a predetermined distance from an outer surface of the housing and connectable to external terminals which extend from an external device, and a device for receiving the external terminal in a part of the housing which is aligned with the connecting terminals.

BRIEF DESCRIPTION OF THE DRAWINGS

The above and other objects, features and advantages of the present invention will become more apparent from the following description taken with the accompanying drawings in which:

FIG. 6A is a perspective view of still another embodiment of the present invention;

FIG. 6B is a section of the arrangement shown in FIG. 6A; and

FIG. 6C is a perspective view of a spacer included in the arrangement of FIG. 6A.

DETAILED DESCRIPTION OF THE EMBODIMENTS

Figure 1:
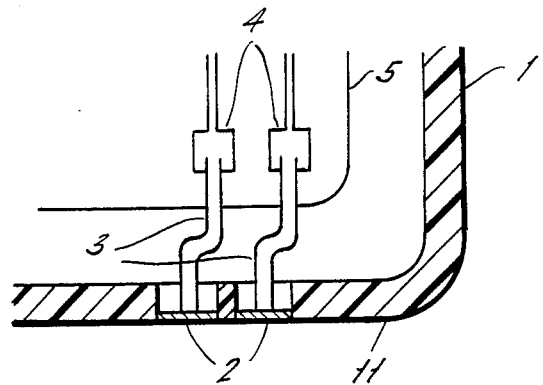
FIG. 1 is a section of a charging terminal structure associated with a prior art housing.

To better understand the present invention, a brief reference will be made to a prior art housing structure for a radio unit, shown in FIG. 1. As shown, charging terminals 2 are fit in a housing in such a manner as to be substantially flush with an outer surface 11 of the housing 1. In this construction, when the housing 1 is brought into contact with or placed near any object on which static electricity has been deposited, the static electricity is undesirably transmitted through the terminals 2, leads 3 and power supply leads 4 to electrical parts (e.g., a central processing unit (CPU) or the like integrated circuit) which are located on a printed circuit board 5. This is likely to cause the CPU and other essential parts to malfunction or even be damaged.

Figure 2:
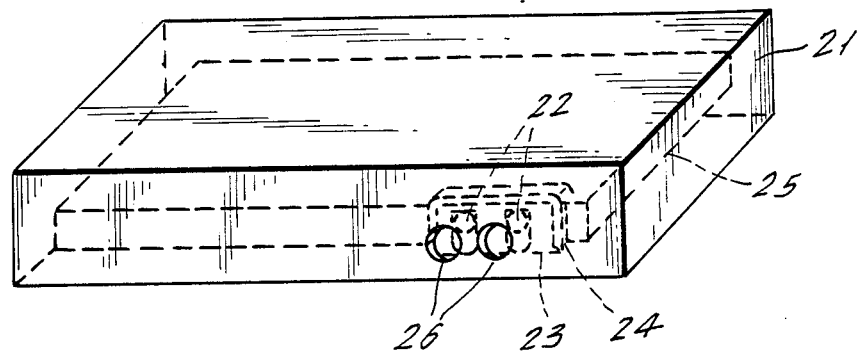
FIG. 2 is a perspective view of a housing structure in accordance with the present invention.

Referring to FIG. 2, a housing structure in accordance with the present invention is shown which is free from the drawback discussed above. In FIG. 2, charging terminals 22 are fixed to a flexible printed wiring board 23 by solder, for example, which in turn is secured to a printed circuit board 25 by means of a terminal plate 24, at a predetermined distance from the outer surface of the housing 21. The terminals 22 are electrically connected to a desired circuit on the printed circuit board 25 through a conductive pattern (not shown) on the flexible printed wiring board 23. The housing 21 is formed with openings 26 in spaced positions which are aligned with the terminals 22. Terminals of a battery charger may be inserted into the housing 21 through the openings 26, as will be described later in detail. The housing 21 is made of a suitable non-conductive material such as polycarbonate. The terminals 22 may be formed on the flexible printed wiring board 23 by plating with gold, silver or the like.

Figure 3:
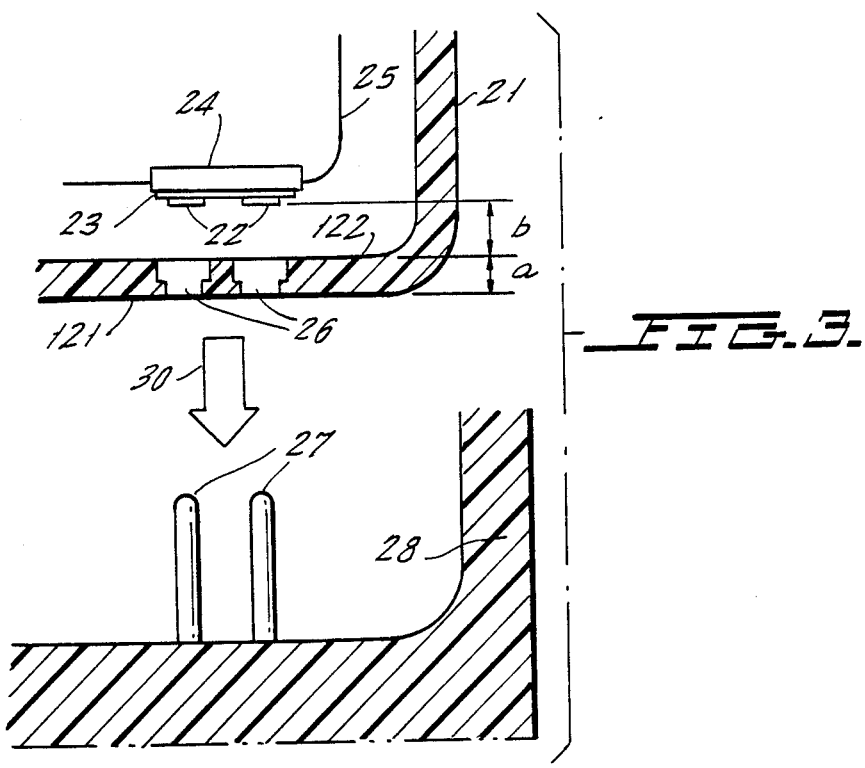
FIG. 3 is a section showing a part of the housing structure of FIG. 2 together with a part of a battery charger applicable thereto.

As shown in detail in FIG. 3, the charging terminals 22 are each substantially perpendicularly fixed to the terminal plate 24 at a predetermined distance (a+b) from the outer surface 121 of the housing 21, where a represents the thickness of the wall of the housing 21 and b the distance between an inner surface 122 and the face of the terminals 22. As described later in detail, the influence of static electricity on the arrangement installed in the housing 21 decreases in proportion to the distance (a+b).

A battery charger, a part of which is shown in FIG. 3, comprises a housing 28 and terminals 27 which extend out from the housing 28. To charge the batteries of the radio unit, the housing 21 will be inserted into the charger housing 28 as indicated by an arrow 30 until the terminals 27 extending from the charger housing 28 make contact with the charging terminals 22 through the openings 26 of the housing 21.

Figure 4:
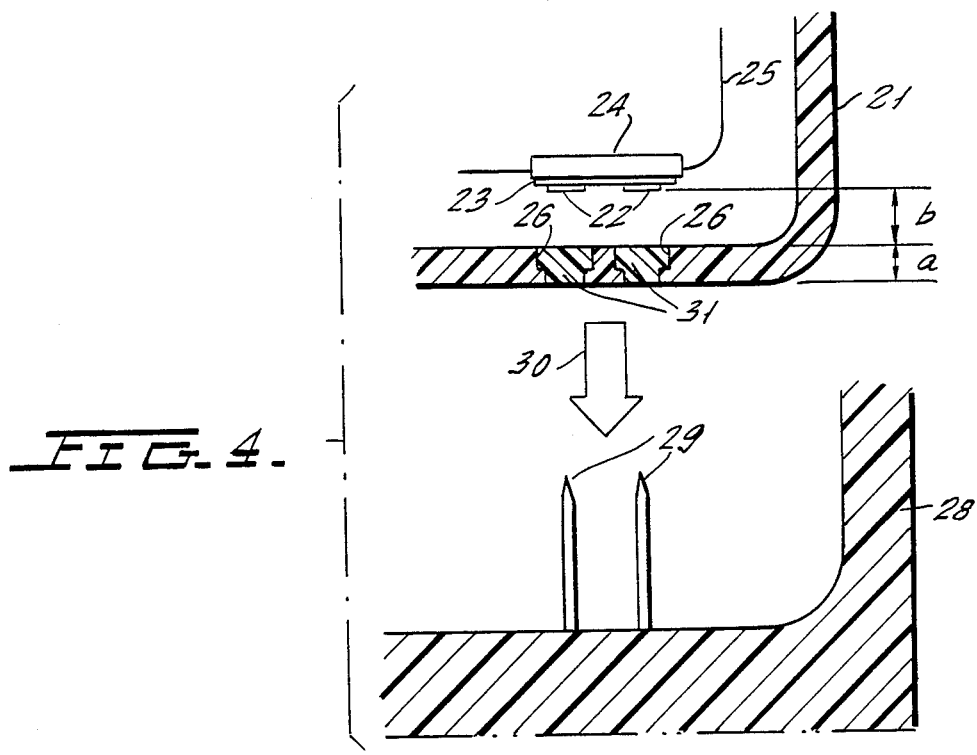
FIG. 4 is a view similar to FIG. 3 but showing another embodiment of the present invention.

Referring to FIG. 4, another embodiment of the present invention is shown. In this particular embodiment, the openings 26 of the housing 21 are plugged with a non-conductive material, or filler, 31 which is elastic enough to allow, for example, pin terminals 29 of a battery charger to readily penetrate it while restoring to its original shape when they are pulled out. An example of such a material 31 may be silicon rubber. The housing structure with the non-conductive filling material 31 achieves greater capacitance and, therefore, withstands a higher electrostatic voltage than the housing structure of FIGS. 2 and 3 in which the openings 26 are simply filled with air. Another advantage attainable with the material 31 is that it prevents dust, water and other impurities from entering the housing 21 through the openings 26.

Figure 5:
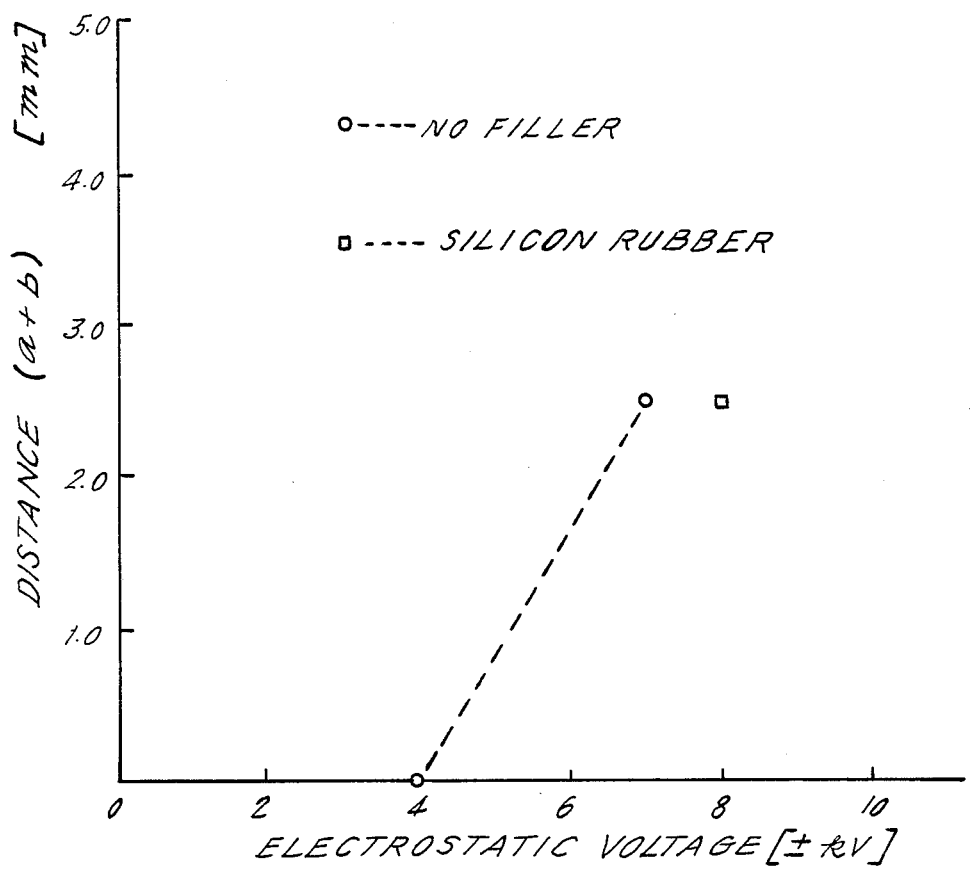
FIG. 5 is a graph showing resistivity of the housing structure of FIGS. 2 and 4 to electrostatic voltage.

Referring to FIG. 5, actual measured electrostatic voltages which the housing structure of the present invention withstands are shown. In FIG. 5, the abscissa represents electrostatic voltages which were applied to the housing structure, where the ordinate represents the distance (a+b) between the charging terminals 22 and the housing outer surface 121. Circles show a case where the openings 26 are not plugged with any filler and a square, plugged with silicon rubber. When charging terminals of a radio equipment were positioned flush with the outer surface of the housing, i.e., $(a+b)=0$ millimeter, a circuit inside the housing malfunctioned at a static voltage of ±4 kilovolts. It has been found by experience that a static voltage of ±4 kilovolts is unsatisfactory for a radio used in North America and northern parts of Europe in wintertime. A withstanding static voltage which is acceptable in practice is about ±7 kilovolts. When the distance (a+b) was increased to 2.5 millimeters, a withstanding voltage as high as approximately ±7 kilvolts was achieved. To meet the demand for small-size and lightweight construction in the pager and like radio units, the wall thickness a of the housing is usually kept to less than about 2.0 millimeters. That is, the distance b between the inner surface of the housing and the terminals needs be about 0.5 millimeters.

Where silicon rubber is filled in the openings of the housing, a higher withstanding static voltage of 1 kilovolt is achieved than without the silicon rubber. Hence, silicon rubber allows the charging terminals to be positioned even in contact with the inner surface of the housing.

Referring to FIG. 6A, still another embodiment of the present invention is shown. As shown, a spacer 32 is interposed between the housing 21 and the terminal plate 24 for preventing dust and water from affecting the circuitry accommodated in the housing 21. In this particular embodiment, the radio unit is provided with five terminals. The upper three of the five terminals are a data terminal, a system clock terminal and a chip enable terminal which are connectable to a printer or like external device. The lower two of the terminals are the positive and negative charging terminals. The housing 21 is formed with openings 26 and the spacer 32 with openings 33, the openings 26 and 33 being each aligned with the five terminals. As shown in FIG. 6B, the circuitry on the printed circuit board 25 is hermetically isolated from the exterior of the housing 21 and, thereby, safeguarded against dust, water and other impurities. The spacer 32 is configured as shown in FIG. 6C and is made of a material having suitable elasticity and air-tightness, e.g., rubber.

In summary, it will be seen that the present invention provides a housing structure for a radio unit which enhances resistivity of the unit to static electricity due to a structure between an outer surface of the housing and charging terminals which is filled with air or a non-conductive material. The non-conductive material prevents dust, water and other impurities from entering the housing.

It will be noted that the housing structure in accordance with the present invention is applicable not only to charging terminals as described above but also to terminals which interconnect a circuitry in a radio equipment to an external device (e.g., input and output terminals).

What is claimed is:

1. Apparatus comprising:
   a housing;
   a circuit board located in said housing and having an electronic component thereon, said electronic component being sensitive to static electricity;
   an inner terminal plate including an inner terminal, said inner terminal being coupled to said circuit board and being electrically connected to said electronic component in such manner that static electricity applied to said inner terminal will be transferred to said electronic component, said inner terminal plate being fixed to said circuit board;
   a housing opening formed in said housing in alignment with said inner terminals to permit an external pin of an external unit to pass through said housing and to contact said inner terminal, said inner terminal being spaced from and out of contact with said housing; and
   a relatively airtight spacer, having resistivity to static electricity, which is interposed between the housing and said inner terminal plate surrounding said housing opening, and having an aperture communicating between said housing opening and said inner terminal.

2. Apparatus according to claim 1, wherein said spacer is comprised of rubber.

3. Apparatus according to claim 1, wherein said aperture is in alignment with said housing opening.

* * * * *